United States Patent
Watanabe et al.

[11] Patent Number: 6,164,516
[45] Date of Patent: Dec. 26, 2000

[54] SOLDERING APPARATUS AND METHOD

[75] Inventors: Masahiro Watanabe; Hoshiro Takahashi, both of Tokyo, Japan

[73] Assignee: Senju Metal Industry Co., Ltd., Tokyo, Japan

[21] Appl. No.: 09/093,783

[22] Filed: Jun. 9, 1998

[51] Int. Cl.[7] .............. B23K 1/00; B23K 1/08; B23K 5/00; B23K 20/08; B23K 20/14
[52] U.S. Cl. .............. 228/37; 228/41; 228/33; 228/6.1; 228/31; 228/46; 228/42
[58] Field of Search .............. 228/37, 41, 33, 228/6.1, 31, 25, 46, 180.1, 244; 438/51, 55, 64, 106

[56] References Cited

U.S. PATENT DOCUMENTS

| | | | |
|---|---|---|---|
| 3,825,164 | 7/1974 | Sarnacki et al. | 228/37 |
| 4,077,467 | 3/1978 | Spigarelli | 165/105 |
| 4,196,024 | 4/1980 | Kenyon | 148/23 |
| 4,637,541 | 1/1987 | Tanny | 228/180.1 |
| 4,684,054 | 8/1987 | Iwasa et al. | 228/180.1 |
| 4,821,948 | 4/1989 | Fisher et al. | 228/223 |
| 4,903,631 | 2/1990 | Morris | 118/63 |
| 4,934,309 | 6/1990 | Ledermann et al. | 118/50 |
| 5,007,369 | 4/1991 | Morris | 118/56 |
| 5,042,708 | 8/1991 | Ledermann et al. | 228/55 |
| 5,145,531 | 9/1992 | Turner et al. | 143/23 |
| 5,447,577 | 9/1995 | Gao et al. | 148/23 |
| 5,507,882 | 4/1996 | Bristol et al. | 148/23 |
| 5,615,828 | 4/1997 | Stoops | 228/223 |
| 5,725,143 | 3/1998 | Leturmy | 228/37 |
| 5,747,102 | 5/1998 | Smith et al. | 427/96 |
| 5,934,540 | 8/1999 | Scheurich | 228/37 |
| 5,981,922 | 10/1999 | Masuda et al. | 219/615 |

*Primary Examiner*—Patrick Ryan
*Assistant Examiner*—Colleen Cooke
*Attorney, Agent, or Firm*—Wenderoth, Lind & Ponack, L.L.P.

[57] ABSTRACT

An automatic soldering apparatus includes a conveyor for conveying a printed circuit board along a predetermined path, a heater located below the conveyor and adapted to heat the lower surface of the printed circuit board on which leads of chips and other electronic parts are to be electrically connected to circuits as printed, a flux applicator located downstream of the heater and arranged to apply a molten flux to the surface of the printed circuit board, and a supply of solder located downstream of the flux applicator and arranged to solder the leads to the circuits. The flux applicator includes a supply of flux for feeding flux in solid form at room temperature, a heater for heating the flux to a temperature above its melting point to provide a molten flux, and a spray nozzle for spraying the molten flux to the surface of the substrate. A supply of hot air is operatively associated with the spray nozzle and adapted to supply hot air under pressure to the spray nozzle, whereby a mist of the molten flux is sprayed onto the surface of the printed circuit board.

20 Claims, 1 Drawing Sheet

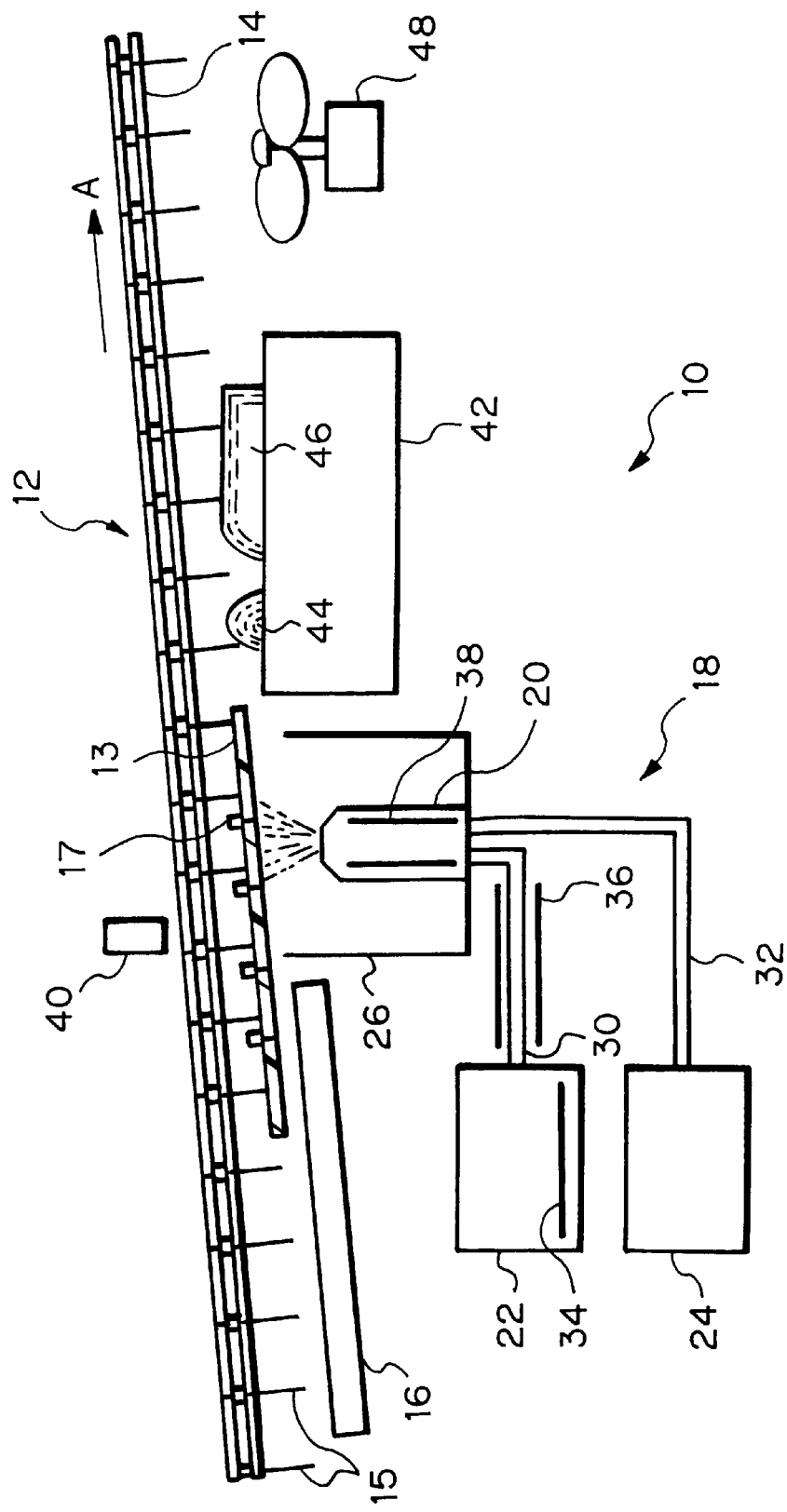

SOLDERING APPARATUS AND METHOD

BACKGROUND OF THE INVENTION

The present invention relates to a soldering apparatus and method for automatically soldering chips and other electronic parts to a printed circuit board.

Typically, a conventional soldering apparatus includes a conveyor for conveying a printed circuit board and a flux applicator located below the conveyor and adapted to apply flux to the printed circuit board. A preheater is located below the conveyor and upstream of the flux applicator and adapted to preheat the printed circuit board. A wave soldering bath is located below the conveyor and downstream of the preheater and adapted to solder chips and other electronic parts to the printed circuit board. A cooling unit is located below the conveyor and downstream of the wave soldering bath and adapted to cool the printed circuit board.

The flux typically contains natural or wood rosin and an activator and is dissolved in alcohol such as isopropyl alcohol. The flux in alcohol is applied to the printed circuit board by the flux applicator. There are currently available two types of flux applicators, that is, a foamed flux applicator and a flux spray. The foamed flux applicator includes a container within which flux dissolved in alcohol is contained, and a porous tube located below the container and adapted to utilize air under pressure to provide foamed flux. A printed circuit board is then brought into contact with the foamed flux. The flux spray includes a supply of flux in alcohol, and a spray nozzle for spraying a mist of the flux onto a printed circuit board. Either of the flux applicators employs flux in alcohol. Typically, the flux contains from 10 to 20 percent by weight of natural rosin together with an activator and 80 to 90 percent by weight of alcohol.

A disadvantage with the use of the flux in alcohol is that fire may occur if great care is not taken. Specifically, the flux in alcohol is subject to volatilization as it is often contacted with the pressurized air. If natural rosin is left within the apparatus, dust may be firmly attached to the rosin. Fire may occur when the volatilized alcohol is absorbed in the dust and exposed to heat dissipated from a preheater or a soldering bath.

Recently, the use of flux in alcohol or volatile organic compound (VOC) is limited, for example, by the laws of the State of California, U.S.A. The volatile organic compound, when exposed to ultraviolet light, produces harmful ozone as a result of photochemical reaction.

There is, thus, a need to provide a soldering flux without the use of any alcohol. Attempts have been made to suspend natural rosin in water. However, such a flux gives off an unpleasant odor during soldering since it uses amine for suspension of the natural rosin. Also, flux residue is corrosive and must therefore be removed to provide as clean a substrate as possible. This type of flux is thus impractical.

Accordingly, it is an object of the present invention to provide a soldering apparatus and method, which has nothing to do with the volatile organic compound regulations, which do not give off any unpleasant odor, and which eliminates the need to clean a substrate.

SUMMARY OF THE INVENTION

According to one aspect of the present invention, there is provided an automatic soldering apparatus comprising a conveyor for conveying a printed circuit board along a predetermined path, the printed circuit board having a lower surface on which a plurality of circuits are formed and an upper surface to which are mounted electronic parts including respective leads extending downwardly through the printed circuit board, a heater for heating the printed circuit board, a flux applicator located adjacent to the predetermined path and downstream of the heater and arranged to apply a molten flux to the lower surface of the printed circuit board, and a supply of solder located adjacent to the predetermined path and downstream of the flux applicator and arranged to apply a solder to the printed circuit board so as to provide an electrical connection between the leads and the corresponding circuits.

A preferred flux may be solid at room temperature and may contain a wood rosin. A typical wood rosin is melted at a temperature of approximately 120° C. to 140° C. If a particular wood rosin has a relatively high melting point, fatty amide or organic acids may be added to the wood rosin so as to lower the temperature at which the wood rosin can be melted. To facilitate soldering, an activator may be added to the flux. Such an activator may preferably be amine hydrochloride such as diethanolamine HCl or amine hydrobromide such as triethanolamine HBr.

The heater may utilize infrared heating, hot air or a combination thereof.

In a preferred embodiment, the flux applicator may include a supply of flux for feeding flux in solid form at room temperature, a heater for heating the flux to a temperature above its melting point, and a spray nozzle for spraying the resulting molten flux to the printed circuit board. The flux applicator may further include a flux supply pipe extending between the supply of flux and the spray nozzle. To maintain the flux in molten form, heaters may be operatively associated with the flux supply pipe and the spray nozzle.

Preferably, a supply of hot air may cooperate with the spray nozzle to feed hot air under pressure, whereby a mist of the molten flux is sprayed onto the printed circuit board.

According to another aspect of the present invention, there is provided a method for soldering electronic parts to a printed circuit board, comprising the steps of providing a soldering apparatus including a conveyor for conveying the printed circuit board, a heater for heating the printed circuit board, a flux applicator located downstream of the heater and arranged to apply a flux to the printed circuit board, and a supply of solder located downstream of the flux applicator and adapted to apply a solder, conveying the printed circuit board along a predetermined path, the printed circuit board having a lower surface on which a plurality of circuits are formed and an upper surface to which are mounted electronic parts including respective leads extending downwardly through the printed circuit board, heating the printed circuit board to a predetermined temperature, applying a molten flux to the lower surface of the printed circuit board, and applying a solder to the printed circuit board so as to provide an electrical connection between the leads and the corresponding circuits.

The printed circuit board may preferably be cooled after the solder is applied.

BRIEF DESCRIPTION OF THE DRAWING

The above and other objects and advantages of the present invention will be readily apparent from the following description of preferred embodiments thereof, when taken in conjunction with the accompanying drawing, in which:

The sole FIGURE shows an automatic soldering apparatus according to one embodiment of the present invention.

DETAILED DESCRIPTION OF THE INVENTION

Referring to the drawing, there is illustrated an automatic soldering apparatus generally indicated by the reference numeral 10 and including an elongated conveyor 12 by which a printed circuit board 13 is conveyed. Electrical circuits are printed on the lower surface of the printed circuit board 13. Chips and other electronic parts 17 are mounted to the upper surface of the printed circuit board 13 and include associated leads. The leads extend downwardly through the printed circuit board 13. In the illustrated embodiment, the conveyor 12 comprises a pair of endless chains 14 (only one is shown) extending parallel to one another. The endless chains 14 are inclined upwards in the direction of conveyance of the printed circuit board 13 as indicated by the arrow A. The endless chains 14 include a plurality of hooks 15 for engaging and supporting the printed circuit board 13.

A heater 16 is arranged below the conveyor 12 and designed to uniformly heat the lower surface of the printed circuit board 13 to a predetermined temperature. A flux applicator 18 is arranged below the conveyor 12 and located downstream of the heater 16. The flux applicator 18 generally includes a spray nozzle 20 for applying flux to the lower surface of the printed circuit board 13 on which leads of the electronic parts 17 are to be electrically connected to the circuits formed thereon, a supply of flux 22 for containing flux in solid form at room temperature, and a supply of hot air 24 for supplying hot air to the spray nozzle 20. The spray nozzle 20 is surrounded by a cover 26. A flux supply pipe 30 extends between the flux supply 22 and the spray nozzle 20. A hot air supply pipe 32 extends between the hot air supply 24 and the spray nozzle 20. The flux supply 22 includes a heater 34 for heating the flux to a temperature above its melting point to supply molten flux. The molten flux is pumped to the spray nozzle 20 through the flux supply pipe 30. To maintain the flux in its molten form, heaters 36 and 38 are operatively associated with the flux supply pipe 30 and the spray nozzle 20, respectively. The hot air supply 24 is adapted to compress air so as to provide hot air. The hot air under pressure is fed to the spray nozzle 20 through the hot air supply pipe 32. A sensor 40 is operatively associated with and located above the flux applicator 18 so as to detect position of the printed circuit board 13.

A wave soldering bath 42 is arranged below the conveyor 12 and located downstream of the flux applicator 18. The wave soldering bath 42 includes a primary nozzle 44 and a secondary nozzle 46. The primary nozzle 44 provides a relatively rough molten wave of solder, whereas the secondary nozzle 46 provides a relatively moderate molten wave of solder.

A cooling unit 48 is arranged below the conveyer 12 and located downstream of the solder bath 42 so as to rapidly cool the printed circuit board 13 after soldering. Preferably, the cooling unit 48 is in the form of a fan capable of providing cooling air at an appropriate speed so as not to blow the printed circuit board 13 off of the conveyor 12.

In use, the printed circuit board 13 is supported by the hooks 15 of the conveyor 12 and transferred in the direction of the arrow A. The printed circuit board 13 is heated to a temperature, preferably, above the melting point of the flux, by means of the heater 16. This enables full and uniform application of the molten flux to the printed circuit board 13 in the following process.

The sensor 40 is operable to detect position of the printed circuit board 13 and send a corresponding signal to a controller (not shown). The controller is electrically connected to the flux supply 22 and the hot air supply 24 so as to control operation of both supplies 22 and 24. The controller is designed to activate the flux supply 22 and the hot air supply 24 when the front end of the printed circuit board 13 is moved immediately above the spray nozzle 20 and deactivate the flux supply 22 and the hot air supply 24 when the rear end of the printed circuit board 13 is moved immediately above the spray nozzle 20. No flux is supplied from the spray nozzle 20 when the printed circuit board 13 is not moving above the spray nozzle 20. The controller allows for ready activation and deactivation of the flux as well as for ready adjustment of the term during which the flux is applied.

The spray nozzle 20 is designed to receive the molten flux pumped from the flux supply 22 and hot air under pressure from the hot air supply 24. The hot air is used to produce a mist of molten flux. The molten flux exhibits adherence and can readily be attached to the lower surface of the printed circuit board 13 so as to facilitate subsequent soldering of the leads to the circuits as printed. If the printed circuit board 13 is not sufficiently heated, the molten flux in mist form will be cooled and solidified upon contact with the lower surface of the printed circuit board 13. As this occurs, the molten flux is firmly adhered to the printed circuit board 13, but will not be uniformly distributed. According to the present invention, the printed circuit board 13 is heated to a sufficient temperature by means of the heater 16 before the flux is applied. This maintains the flux in its molten form when it is applied to the printed circuit board 13 and allows the molten flux to uniformly flow over the lower surface of the printed circuit board.

The printed circuit board 13 is thereafter transferred to the wave soldering bath 42. Now that the printed circuit board 13 is sufficiently heated, the printed circuit board 13 and the electronic parts 17 are free from deformation or damage if they are abruptly introduced into the wave soldering bath within which molten solder at high temperature is present. Illustratively, the printed circuit board 13 is first moved over a relatively rough molten wave of solder supplied from the primary nozzle 44. The rough molten wave of solder is forced into through holes formed in the printed circuit board. The use of the rough molten wave of solder, on the other hand, may form undesirable bridges between areas to be soldered and burrs at the front end of leads. Advantageously, the moderate molten wave of solder supplied from the secondary nozzle 46 serves to eliminate such bridges and burrs.

After soldering, the printed circuit board 13 is cooled to a temperature below the melting point of the solder by means of the fan 48 so that the solder can rapidly be hardened. The solder may, otherwise, crack or break if the printed circuit board 13 is vibrated or impacted before the solder is sufficiently hardened.

EXAMPLE

A flux is prepared as containing 10 percent by weight of fatty amide, 1 percent by weight of triethanolamine HBr and 89 percent by weight of wood rosin. The printed circuit board is heated to a temperature of approximately 110° C. The flux is heated to a temperature of approximately 110° C. The resulting molten flux is applied to the printed circuit board. The printed circuit board is, thereafter, moved over a molten wave of solder in the wave soldering bath. Test results show that the printed circuit board and chips and other electronic parts are free from substantial deformation or thermal damage, and the leads are fully soldered to the circuits without leaving any unsoldered part.

The present invention has been described with respect to its preferred embodiment. It is to be understood that various modifications and changes may be made without departing from the spirit and scope of the invention as defined by the appended claims.

What is claimed is:

1. An automatic soldering apparatus, comprising:
   a conveyor to convey a printed circuit board along a predetermined path, the printed circuit board having an upper surface to which electronic parts are to be mounted and a lower surface on which a plurality of circuits are to be formed, and the electronic parts including leads extending downwardly through the printed circuit board;
   a first heater associated with said conveyor to preheat the printed circuit board;
   a flux applicator located adjacent to the predetermined path and downstream of said first heater, with said flux applicator including
   (i) a flux supply system to provide a solid flux at room temperature,
   (ii) a second heater to heat the solid flux to a temperature above its melting point and thereby provide a molten flux, and
   (iii) a spray nozzle connected to said flux supply system;
   an air supply system to supply hot air under pressure to said spray nozzle, such that a mist of the flux is deposited onto the lower surface of the printed circuit board; and
   a solder supply system located adjacent to the predetermined path and downstream of said flux applicator and arranged to apply a solder to the printed circuit board such that an electrical connection is obtained between the leads of the electronic parts and corresponding circuits.

2. The apparatus according to claim 1, and further comprising a supply of solid flux at room temperature in operable association with said flux applicator.

3. The apparatus according to claim 2, and further comprising a supply of hot air in operable association with said air supply system.

4. The apparatus according to claim 3, and further comprising a supply of solder in operable association with said solder supply system.

5. The apparatus according to claim 4, wherein said flux applicator further comprises a flux supply pipe connected between said flux supply system and said spray nozzle, and a third heater operatively associated with said flux supply pipe.

6. The apparatus according to claim 4, and further comprising a fourth heater operatively associated with said spray nozzle.

7. The apparatus according to claim 4, wherein said solder supply system includes a wave soldering device having a primary nozzle to provide a relatively rough molten wave of solder and a secondary nozzle to provide a relatively moderate wave of solder.

8. The apparatus according to claim 4, and further comprising a cooling device located downstream of said solder supply system to cool the printed circuit board.

9. The apparatus according to claim 8, wherein said cooling device includes a fan.

10. The apparatus according to claim 4, wherein said air supply system includes a compressor.

11. The apparatus according to claim 1, and further comprising a supply of air in operable association with said air supply system.

12. The apparatus according to claim 11, and further comprising a supply of solder in operable association with said solder supply system.

13. The apparatus according to claim 2, and further comprising a supply of solder in operable association with said solder supply system.

14. The apparatus according to claim 1, and further comprising a supply of solder in operable association with said solder supply system.

15. The apparatus according to claim 1, wherein said air supply system includes a compressor.

16. The apparatus according to claim 1, wherein said flux applicator further comprises a flux supply pipe connected between said flux supply system and said spray nozzle, and a third heater operatively associated with said flux supply pipe.

17. The apparatus according to claim 1, and further comprising a fourth heater operatively associated with said spray nozzle.

18. The apparatus according to claim 1, wherein said solder supply system includes a wave soldering device having a primary nozzle to provide a relatively rough molten wave of solder and a secondary nozzle to provide a relatively moderate wave of solder.

19. The apparatus according to claim 1, and further comprising a cooling device located downstream of said solder supply system to cool the printed circuit board.

20. The apparatus according to claim 19, wherein said cooling device includes a fan.

* * * * *